United States Patent [19]

Edvardsen

[11] Patent Number: 4,521,742
[45] Date of Patent: Jun. 4, 1985

[54] AMPLIFIER POWER SUPPLY WITH LARGE DYNAMIC HEADROOM

[75] Inventor: Erik Edvardsen, London, England

[73] Assignee: NAD Holding Limited, London, England

[21] Appl. No.: 582,013

[22] Filed: Feb. 22, 1984

Related U.S. Application Data

[63] Continuation of Ser. No. 327,424, Dec. 4, 1981, abandoned.

[51] Int. Cl.³ .............................................. H03F 3/04
[52] U.S. Cl. .................................... 330/289; 330/297; 330/298
[58] Field of Search ............... 330/266, 272, 285, 289, 330/297, 298; 455/117, 127

[56] References Cited

U.S. PATENT DOCUMENTS

| | | | |
|---|---|---|---|
| 3,866,136 | 2/1975 | Agustin et al. | 455/117 X |
| 4,114,108 | 9/1978 | Faulkenberry et al. | 455/117 X |
| 4,122,400 | 10/1978 | Medendorp et al. | 455/117 X |
| 4,158,180 | 6/1979 | Challen | 455/117 X |

Primary Examiner—James B. Mullins
Assistant Examiner—Steven J. Mottola
Attorney, Agent, or Firm—Jerry Cohen; Herbert L. Bello; M. Lawrence Oliverio

[57] ABSTRACT

Audio power amplifier and other related amplifiers (e.g., radio frequency control amplifiers) with means responsive to output power stage VI product to continuously adjust power supply voltage level via a negative feedback signal inversely proportional to VI product, with nonlinearity at upper limit approach and stabilize VI product or dissipation, adjust to varying load impedance, and to allow lower rated power supply components for a given amplifier task compared to prior art approaches.

22 Claims, 5 Drawing Figures

AMPLIFIER POWER SUPPLY WITH LARGE DYNAMIC HEADROOM

This application is a continuation of application Ser. No. 327,424, filed 12/04/81, now abandoned.

BACKGROUND OF THE INVENTION

The present invention relates to power amplifiers e.g., audio amplifiers, operating over a wide range of voltage frequencies and amplitudes handled and driving a varying effective load impedance (e.g., a speaker).

A power amplifier for music reproduction in loudspeakers must reproduce the input voltage amplified by a suitable amount typically in the 20 to 40 db range and supply it to a load which can be resistive or reactive or any combination of the two and of value anywhere from abt 2 ohms to 10 ohms nominal or average, but which can vary between 1 ohm and 100 ohms over the audio range and which increases with temperature and varies instantaneously with level. This voltage varies between 0 and clipping level and typically has a peak to average ratio of between 5 and 20 db.

One important problem with this is that a transformerless output stage with a fixed supply voltage designed for one particular load impedance will be extremely inefficient operating into a much lower impedance and will on the other hand deliver only a fraction of its normal power into a much higher impedance.

Varying the supply voltage in proportion to the square root of the load impedance solves this problem, but is not an optimum solution.

It is an important object of the invention to provide an improvement in power amplifier power supplier with voltage varying means constructed such that at very low and very high average power the available safe maximum output will be much higher than for an amplifier with a fixed supply voltage.

It is a further object of the invention to provide that when the signal processed by the amplifier is music or the like irregular wave form and the load is a speaker or the like, the amplifier will for a majority of operating time operate at a higher voltage hence having a much higher available peak output level compared to levels used for regular wave forms and simple resistive loads, consistent with one or more of the preceding objects.

It is a further object of the invention to provide that the amplifier will give essentially the same power into any impedance from 2 ohms to 8 and the supply will adjust itself (pre set its maximum voltage) for constant worst case dissipation, consistent with one or more of the preceding objects.

It is a still further object of the invention to provide that the output stage temperature will remain within a smaller range since the thermal feedback tends to stabilize the dissipation, hence the temperature, so that long-term reliability will be improved, consistent with one or more of the preceding objects.

It is a still further object of the invention to allow making a variable supply an efficient, simple and inexpensive low-frequency thyristor switching supply, so that losses are substantially limited to the IR drop in the transformer line (power end) of the supplier, consistent with one or more of the preceding objects.

It is a still further object of the invention to make an amplifier with a given supply and output power stage behave as though it had at least twice the power-rating of a conventional amplifier with the same supply and output stage, consistent with one or more of the preceding objects.

SUMMARY OF THE INVENTION

The foregoing objects are achieved in accordance with the invention by a power amplifier comprising a heat generating power output stage in said power amplifier, a power supply for providing power to said power amplifier, means for sensing the heat produced by said power output stage and providing a signal inversely proportional thereto for controlling the voltage output level of said power supply, to thereby continuously adjust supply voltage to an optimum level in relation to varying load impedance and stabilize current in the output stage.

The feedback is arranged to have a nonlinear response to increase degree of negative feedback when heat (power dissipation) sensed reaches predetermined limits.

Power amplifier safe operation limits are defined by the allowed and instantaneous VI product of the output stage of a power amplifier. The heat associated with the power output stage, or more particularly the heat sink, which mounts the semicnductors of the output stage, is roughly proportional to the average dissipation of the output stage. Therefore, the temperature information at the heat sink can be negatively fed back to control the voltage level of the power supply which drives the power amplifier and its output stage. In this way the temperature of the heat dissipation level of the output stage can always be kept at or below a safe limit while at the same time the voltage level at which the power supply operates is at its highest possible level. The feedback signal is inversely proportional to the temperature sensed. Thus as the temperature rises, the voltage output of the power supply will be decreased.

If the amplifier is operated at very low or very high average power, into an impedance which is high over the music spectrum in question, then the dynamic headroom will be very high since the temperature is very low and the supply voltage is at its maximu. This dynamic headroom is a headroom lasting for several minutes. This is because the thermal time-constant of the heatsink is around ten minutes. Hence, sustained high level musical notes as voices or solo wind instruments will not be clipped. The response is in essence desensitized for such short term peaks. An automatic implementation of this approach is accomplished through the improved amplifier power supply of the present invention.

When the dissipation is very high, as when playing rock music with a peak to average ratio long term of as little as 4 db, the supply voltage will drop to reduce the dissipation until the temperature stabilizes at a safe value. Fortunately the type of music which demands the highest dynamic range is typically the least demanding on the amplifier in terms of dissipation. In much classical music the average power for a large proportion of the time is very low, e.g., less than 5 watts with occasional peaks at very high levels. The corresponding short term peaks are up to 400 watts with an average level during a passage lasting a few minutes being as high as 150 watts.

The amplifier power supply of the present invention, enables these amplifier conditions:

1. going into any impedance, the amplifier has a very large dynamic headroom (4 db);

2. over a short-term (several minutes), substantial continuous clipping power as demanded on solo voices and instruments (in a conventional amplifier with large dynamic headroom, the supply collapses after a fraction of a second);

3. greatest headroom when it is most needed, i.e., when the peak to average ratio is very large;

4. under all practical use conditions, the amplifier delivers more undistorted power into 8 ohms and 8 ohms rated speakers than comparable prior art amplifiers;

5. for professional application due to the unique adaptability and tolerance of the most extreme varied operating conditions combined with design for long term reliability;

6. running a short term (IHF headroom) output of over 400 watts and a medium term continuous output of nearly 300 watts with a minimum rating of 100 watts and with adequate power to satisfy state of the art stereo listening requirements and the like; and 7. short term output of well over 1 kW which means even low effeciency speakers will be driven to sound pressure levels of near 120 db.

Other objects, features and advantages will occur from the following description of preferred embodiments, made with reference to the accompanying drawing in which:

DETAILED DESCRIPTION OF PREFERRED EMBODIMENTS

Figure 1:
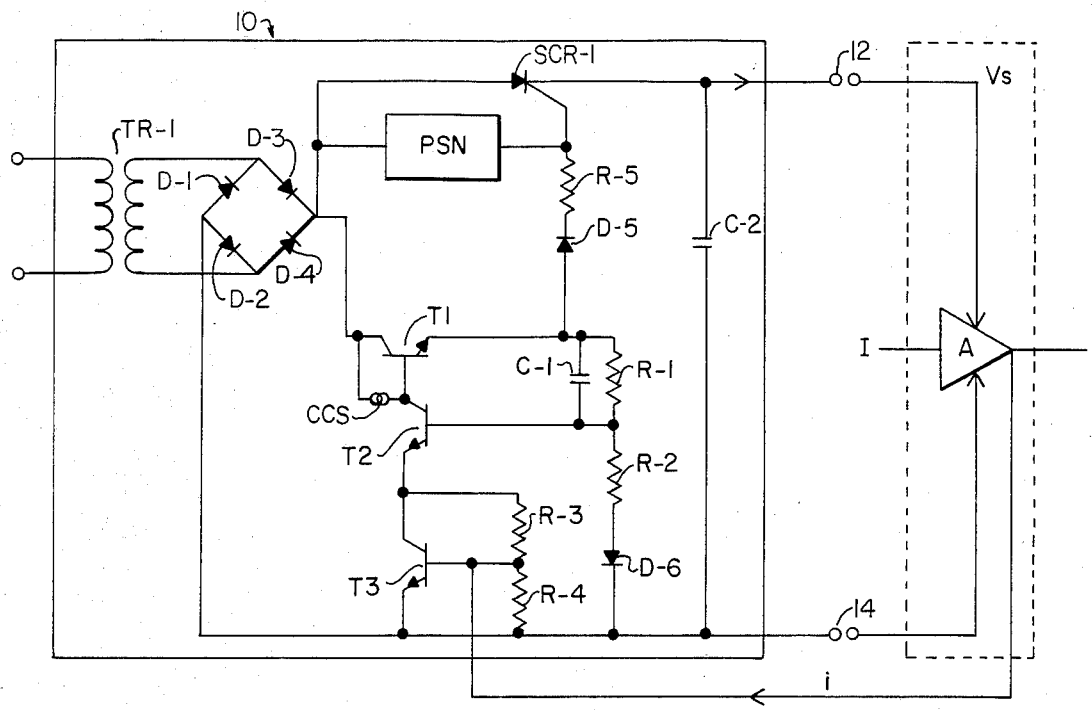
FIG. 1 is a circuit diagram of an amplifier with improved power supply in accordance with a preferred embodiment of the invention.

Referring now to FIG. 1, there is shown a power supply device 10 in accordance with a preferred embodiment of the invention. The power supply device comprises (with typical component selection values):

Transformer Tr-1 117 V., single phase rectifier-diodes D1–D4, IN5401, diode D5, IN4002, and D6, IN914.

| SCR-1: | C116B | | |
|---|---|---|---|
| Transistor-T1: | BD139 | Resistors R-1: | 27K Ohms, ¼ W |
| Transistor-T2: | " | Resistors R-2: | 22K Ohms, ¼ W |
| Transistor-T3: | " | Resistors R-3: | 27K Ohms, ¼ W |
| | | Resistors R-4: | 1K Ohms, ¼ W |
| | | Resistors R-5: | 1K Ohms, ½ W |

Constant current source: 10YG2.0
Capacitors C-1 (10 mf) and C-2 (4700 mf, 80 volts).

This circuitry provides a slow acting power supply utilizing thyristor (e.g., the above SCR-1 or equivalent) to switch on full rectified voltage supply (from bridge rectifier D1–D4) once every cycle of full wave rectified signal. The phase shift network PSN varies conduction angle to assure that just enough current is turned on every cycle to keep average output voltage at terminals 12, 14 at a desired level.

The power supply 10 provides output voltage at terminals 12, 14 to an amplifier A (with input I and output O). A feedback loop from the amplifier's output stage provides current I which is adapted to the circuit of FIG. 1 to vary in direct proportion to the instantaneous voltage times current product of the output stage.

For single phase, 60 cycle operation, the period (wavelength) of supply frequency is about 18 milliseconds. Conduction period for SCR-1 is generally in the range of 3 to 15 milliseconds of each cycle. The selection of components for device 10, described above, satisfies the general condition of the present invention that the reaction time of the device be about one-half the period of supply frequency, i.e., 18 to 36 milliseconds. This allows transient occurrences of high-level peaks to pass undistorted before supply voltage at terminals 12, 14 is reduced by device 10. This allows utilization of short term ability of amplifiers to operate above rated steady state conditions to increase dynamic power available to amplifier A. For instance, an output transistor of the amplifier might be rated for operation at 3.5 amperes/50 volts D.C., but tolerating up to 7 amperes at the same voltage for 10 millisecond durations.

There should be coupled with this restraint of control to allow greater dynamic power availability, a means for limiting maximum dissipation at an absolute value. This can be done by introducing a feedback loop gain when the amplifier's output transistor rises over a certain temperature (as indicated by corresponding VI product or through direct temperature detection at the transistor's heat sinked body).

The output supply voltage $V_s$ of device 10 is determined by the resistor network R1–R4 and transistor T3's base-emitter voltage $V_{be}$ in accordance with the equation:

$$V_s = \frac{(R1 + R2)(R3 + R4)}{(R2)(R4)} V_{be} = k_3 V_{be} \quad (1)$$

The power dissipation-related current i can then be factored in:

$$V_s = \frac{R1 + R2}{R2} \times \frac{R3}{R4} \left[ V_{be}\left(1 + \frac{R4}{R3}\right) - R4i \right] \quad (2)$$

$$= K_4 V_{be} - K_5 i$$

Figure 2:
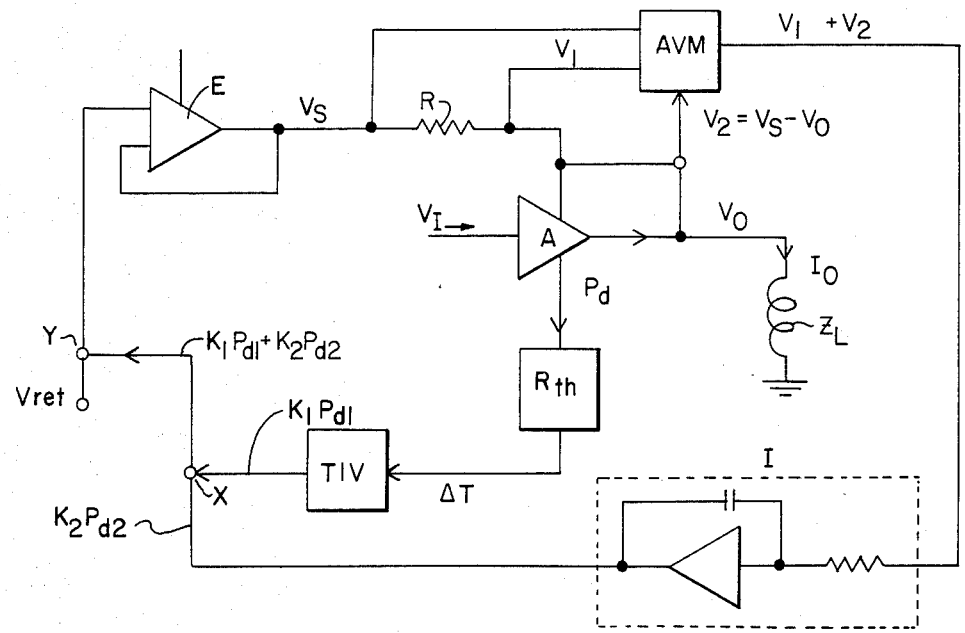
FIG. 2 is a block diagram of a more generalized format of the FIG. 1 device.

FIG. 2 shows the same circuit or equivalents in block diagram form. The power amplifier A drives an impedance load (e.g., a speaker coil) with a current $I_6$ at voltage $V_O$ and utilizes (at least for its last output stage) a supply voltage $V_s$. A reference voltage $V_1$ is developed from $V_s$ using a resistor and multiplied by $V_2 = (V_s - V_O)$ in an analog voltage multiplier AVM to provide a feedback signal: $b_2 I_o (V_s - V_O)$ which is fed back via an integrator I to a junction X. A feedback loop from the last output stage of A (verying directly with power dissipation therein) provides via a resistor $R_{th}$ and a temperature/voltage convertor T/V (e.g., a thermistor) a $k_1 Pd_1$ factor current junction X. The sum:

$$k_1 Pd_1 + k_2 Pd_2 \quad (3)$$

is supplied to junction Y (as a negative additive factor) with a reference voltage V ref, to produce an overall control at an active element E.

The correspondences between the general FIG. 2 diagram and the more specific embodiments of the FIG. 1 circuit are:

| FIG. 2 | FIG. 1 |
| --- | --- |
| V ref source/E | TR-1, D1–D4, SCR-1, PSN |
| R | R5 |
| AVM | R1–R4 |
| T/V | T3 |

Several variants can be made from the devices described above specifically and generally within the scope of the invention. For instance, in the FIG. 1 circuit, the feedback loop i can be replaced or supplemented by a thermal loop wherein transistor T3 and/or R3 (constructed as a thermistor) are in heat exchange relation with the output transistor of amplifier A.

The feedback control can come from the transformer TR-1, e.g., by providing an auxiliary high resistance winding to the transformer and a balancing reference resistor.

Figures 3A, 3B:
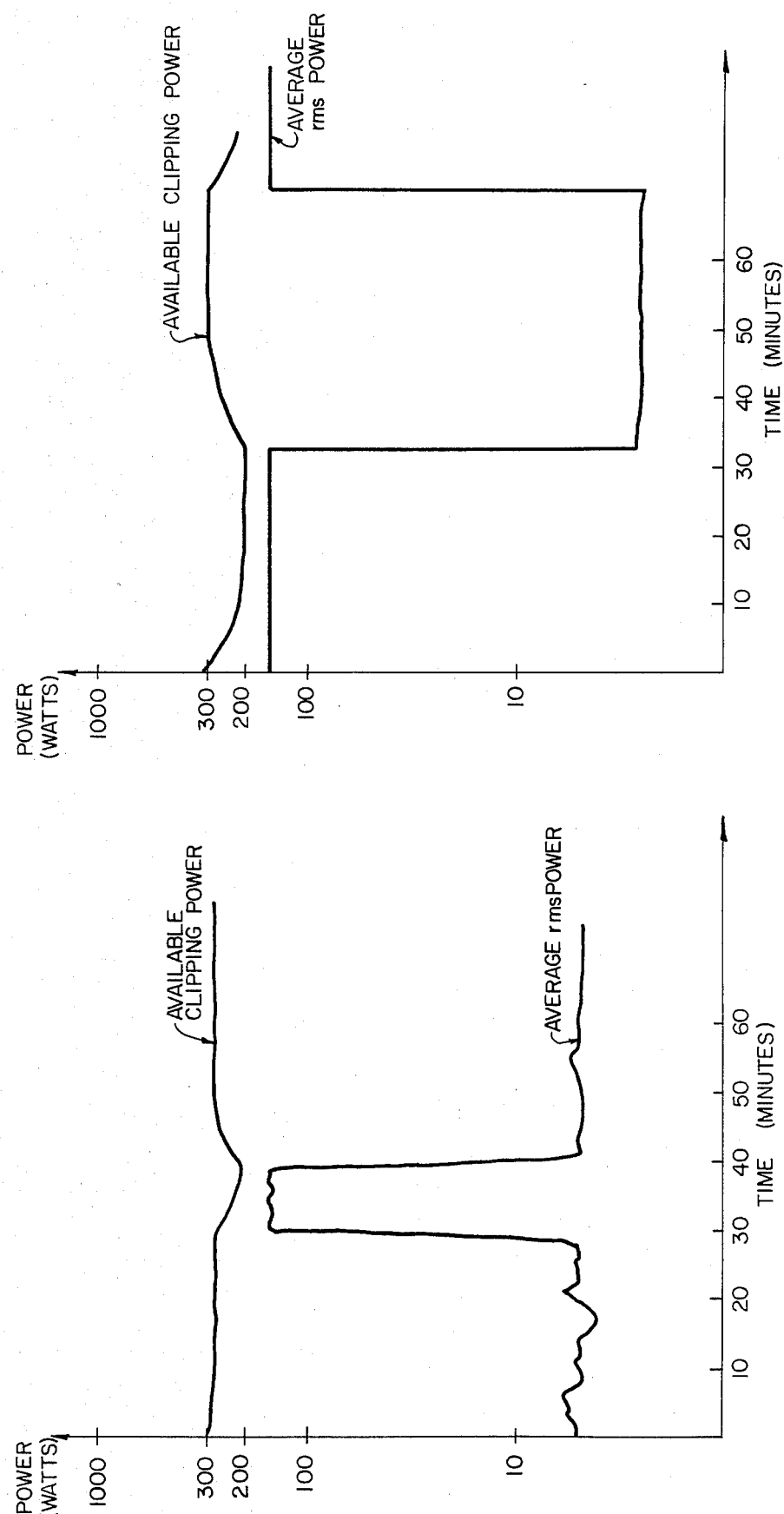
FIGS. 3A and 3B are semilog power vs. time traces showing the effect of operating with rms power levels distant from and close to the level of available clipping power.
Figure 4:
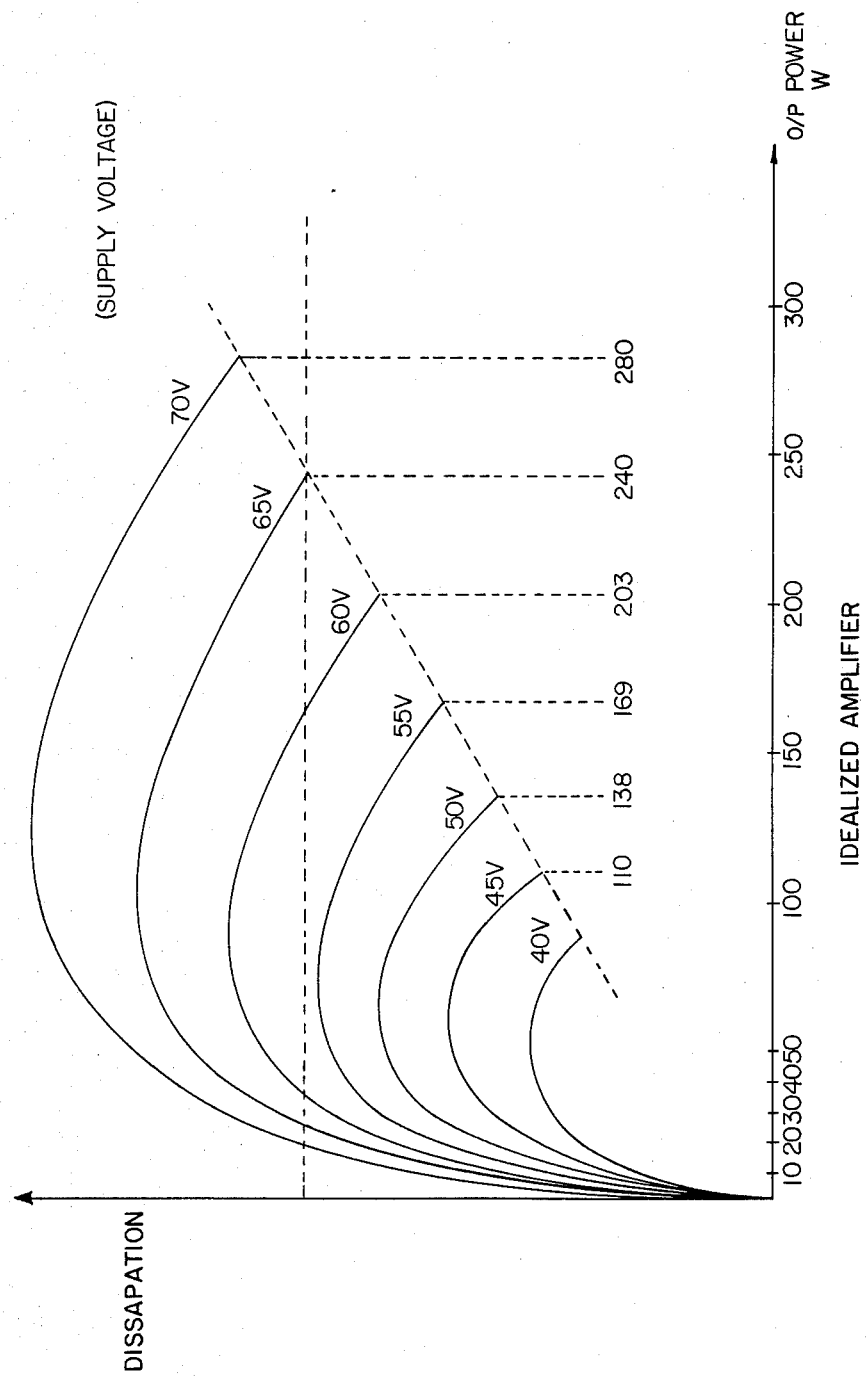
FIG. 4 is a linear power dissipation vs. power family of tracks at various supply voltages.

FIGS. 3A and 3B show two headroom situations, the first (FIG. 3A) in which, for example rock music is played with a dynamic range of 4 dB speaking at 400 watts with an average level of 150 watts. Supply voltage will gradually drop until its clipping level is 200 watts. Thus peaks are clipped by 3 dB. But clipping as provided in this invention (FIG. 3B) does not change sound audibly.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

1. A power supply for use with a power amplifier having a predetermined maximum time-averaged operating power, said power supply comprising,
    means capable of supplying power to said amplifier,
    means responsive to the instantaneous power dissipated in said amplifier for controlling the power provided by said supplying means to said amplifier so that, under steady-state conditions, the instantaneous power provided to said amplifier is at most equal to said maximum time-averaged operating power, and
    means for delaying the operation of said controlling means for a first predetermined time interval so that the instantaneous power supplied by said supplying means to said amplifier can exceed said predetermined maximum time-averaged operating power for said first predetermined time interval.

2. A power supply in accordance with claim 1 further comprising means responsive to the time-averaged power supplied to said amplifier for reducing the instantaneous power provided by said supplying means to said amplifier after a second time interval.

3. A power supply in accordance with claim 2 wherein the magnitude of said second time interval is at least one order greater than the magnitude of said first time interval.

4. A power supply in accordance with claim 2 wherein said reducing means reduces the power provided to said amplifier by said supplying means when the time-averaged power supplied to said amplifier exceeds a predetermined power level for said second time interval.

5. A power supply in accordance with claim 1 wherein the magnitude of said first predetermined time interval is of the same order as the magnitude of the period of the power supply frequency.

6. A power supply in accordance with claim 5 wherein said first predetermined time interval is one-half the period of the power supply frequency.

7. A power supply in accordance with claim 1 wherein said controlling means comprises
    a regulator circuit connected between said supplying means and said power amplifier, said regulator circuit being controllable to regulate the amount of power provided from said supplying means to said amplifier, and
    feedback means responsive to the instantaneous power dissipation of said amplifier for controlling said regulator means.

8. A power supply in accordance with claim 7 wherein said reducing means comprises means responsive to the time-averaged power dissipation of said amplifier for changing the gain of said feedback means.

9. A power supply in accordance with claim 8 wherein said power amplifier comprises a heat generating output stage and said reducing means comprises means responsive to the temperature of said output stage for changing the gain of said feedback means.

10. A power supply in accordance with claim 9 wherein said reducing means comprises means responsive to the temperature of said output stage for changing the gain of said feedback means when said temperature exceeds a predetermined value.

11. A power supply for use with a power amplifier having an output stage and a predetermined maximum time-averaged operating power, said power supply comprising,
    means capable of supplying time-averaged power to said amplifier in excess of said maximum time-averaged operating power,
    a regulator circuit controllable to regulate the instantaneous amount of power provided from said supplying means to said amplifier,
    a feedback circuit responsive to the instantaneous power dissipation of said output stage for controlling said regulator means to maintain the instantaneous power dissipation in said amplifier below said predetermined maximum time-averaged operating power under steady-state conditions, said feedback circuit having a first time constant so that the instantaneous power supplied by said supplying means to said amplifier can exceed said predetermined maximum time-averaged operating power for a first predetermined time interval, and
    means responsive to the average power dissipation of said output stage for changing the gain of said feedback circuit, said changing means having a second time constant so that the instantaneous power provided by said supplying means to said amplifier is reduced after a second predetermined time interval.

12. A power supply in accordance with claim 11 wherein said changing means changes the gain of said feedback circuit after the time averaged power provided to said amplifier has exceeded said predetermined maximum time-averaged operating power for said second time interval so that the time-averaged operating power provided to said amplifier is reduced to a value less than said maximum time-averaged operating power.

13. A power supply in accordance with claim 12 wherein said output stage is heat-generating and said changing means comprises means responsive to the temperature of said output stage for changing the gain of said feedback circuit.

14. A power supply in accordance with claim 13 wherein said second time constant is a thermal time constant.

15. A power supply in accordance with claim 11 wherein said first time constant is determined by component values in said feedback circuit.

16. A power supply in accordance with claim 11 wherein the magnitude of said first predetermined time interval is of the same order as the magnitude of the period of the power supply frequency.

17. A power supply in accordance with claim 16 wherein said first predetermined time interval is one-half the period of the power supply frequency.

18. A power supply in accordance with claim 11 wherein the magnitude of said second predetermined time interval is at least one order greater than the magnitude of said first time interval.

19. A power supply for use with a power amplifier having a heat-generating output stage and a predetermined maximum time-averaged operating power, said power supply comprising, an unregulated power supply capable of supplying time-averaged power to said amplifier in excess of said maximum time-averaged operating power, a thyristor regulator circuit connected between said supply and said power amplifier, said regulator circuit being responsive to feedback signals for regulating the instantaneous voltage provided from said supply to said amplifier, means for sensing the instantaneous output current in said output stage, means for sensing the instantaneous voltage across said output stage, a multiplier circuit responsive to said instantaneous current and to said instantaneous voltage for generating a product representative of the instantaneous power dissipation of said output stage a negative feedback circuit for generating feedback signals to control said thyristor regulator circuit, said feedback circuit having a first time constant so that the instantaneous power supplied by said supply to said amplifier can exceed said predetermined maximum time-averaged operating power for a first predetermined time interval, and means responsive to the temperature of said output stage for increasing the amount of negative feedback when said temperature exceeds a predetermined value.

20. A power supply in accordance with claim 19 wherein said feedback circuit time constant is determined by component values in said feedback circuit.

21. A power supply in accordance with claim 20 wherein the magnitude of said first predetermined time interval is of the same order as the magnitude of the period of the power supply frequency.

22. A power supply in accordance with claim 21 wherein said feedback circuit time constant is between 18 and 36 milliseconds.

* * * * *